(12) United States Patent
Yoshimura et al.

(10) Patent No.: US 10,263,076 B2
(45) Date of Patent: Apr. 16, 2019

(54) SEMICONDUCTOR DEVICE HAVING A GATE ELECTRODE EMBEDDED IN A TRENCH

(71) Applicant: ABLIC Inc., Chiba-shi, Chiba (JP)

(72) Inventors: Mitsuhiro Yoshimura, Chiba (JP); Masahiro Hatakenaka, Chiba (JP)

(73) Assignee: ABLIC INC., Chiba (JP)

( * ) Notice: Subject to any disclaimer, the term of this patent is extended or adjusted under 35 U.S.C. 154(b) by 2 days.

(21) Appl. No.: 15/874,342

(22) Filed: Jan. 18, 2018

(65) Prior Publication Data

US 2018/0269287 A1   Sep. 20, 2018

(30) Foreign Application Priority Data

Mar. 14, 2017   (JP) ................... 2017-048798

(51) Int. Cl.
  *H01L 29/423*   (2006.01)
  *H01L 29/06*   (2006.01)
  *H01L 29/10*   (2006.01)
  *H01L 29/66*   (2006.01)
  *H01L 29/78*   (2006.01)
  *H01L 29/739*   (2006.01)

(52) U.S. Cl.
  CPC ...... *H01L 29/0696* (2013.01); *H01L 29/1095* (2013.01); *H01L 29/4236* (2013.01); *H01L 29/66348* (2013.01); *H01L 29/66734* (2013.01); *H01L 29/7397* (2013.01); *H01L 29/7813* (2013.01)

(58) Field of Classification Search
  CPC .......... H01L 29/1095; H01L 29/66734; H01L 29/7813; H01L 29/4236; H01L 29/1004; H01L 29/66712; H01L 29/732; H01L 29/7802; H01L 29/8083; H01L 29/7397; H01L 29/66348
  See application file for complete search history.

(56) References Cited

U.S. PATENT DOCUMENTS

| 7,709,890 B2 * | 5/2010 | Yoshimura .......... H01L 29/0646 257/330 |
| 2004/0031993 A1 * | 2/2004 | Okada .................. H01L 29/739 257/368 |

(Continued)

FOREIGN PATENT DOCUMENTS

| JP | 2003-101027 | * | 4/2003 | ............. H01L 29/78 |
| JP | 2003-101027 A | | 4/2003 | |

*Primary Examiner* — Khiem D Nguyen
(74) *Attorney, Agent, or Firm* — Brinks Gilson & Lione

(57) ABSTRACT

To obtain a semiconductor device in which a reduction in channel formation density in a trench extending direction is suppressed, provided is a semiconductor device including a first region and a second region alternately arranged in the trench extending direction. The first region includes a first front surface semiconductor electrode layer of a first conductivity type having a portion along an outer side surface of the trench from the front surface of the semiconductor device to the first height to which a gate electrode is embedded into the trench. The second region includes a base contact region having a depth from the front surface of the semiconductor device to the second height higher than the first height and a second front surface semiconductor electrode layer of the first conductivity type from the first height to the second height.

6 Claims, 10 Drawing Sheets

(56) References Cited

U.S. PATENT DOCUMENTS

| | | | | |
|---|---|---|---|---|
| 2011/0291110 A1* | 12/2011 | Suzuki | ............... | H01L 29/0878 |
| | | | | 257/77 |
| 2011/0291186 A1* | 12/2011 | Yilmaz | ............... | H01L 29/4236 |
| | | | | 257/334 |
| 2014/0299914 A1* | 10/2014 | Yilmaz | ............. | H01L 21/26586 |
| | | | | 257/139 |
| 2015/0263150 A1* | 9/2015 | Matsudai | ............ | H01L 29/7397 |
| | | | | 257/139 |
| 2017/0271324 A1* | 9/2017 | Kumagai | ............ | H01L 27/0617 |

* cited by examiner

SEMICONDUCTOR DEVICE HAVING A GATE ELECTRODE EMBEDDED IN A TRENCH

RELATED APPLICATIONS

This application claims priority under 35 U.S.C. § 119 to Japanese Patent Application No. 2017-048798 filed on Mar. 14, 2017, the entire content of which is hereby incorporated by reference.

BACKGROUND OF THE INVENTION

1. Field of the Invention

The present invention relates to a semiconductor device, and more particularly, to a semiconductor device that includes a vertical transistor with a trench gate.

2. Description of the Related Art

As one of related-art vertical transistors, the following vertical MOSFET is proposed, which is disclosed in, for example, Japanese Patent Application Laid-open No. 2003-101027. Specifically, a gate electrode is formed only in the lower part of a trench formed in a substrate, and the upper part of the trench is embedded with an insulating film for insulating a source electrode and the gate electrode from each other, so that the upper surface of the insulating film is substantially coplanar with the surface of the substrate. The source electrode is formed on the plane. This configuration eliminates a contact opening for connecting a source electrode formed on an insulating film to a source region and a base contact region of the surface of a substrate, which is necessary in a case in which a gate electrode is embedded up to the upper part of a trench, and an insulating film is formed on the surface of a substrate. As a result, an interval between the adjacent trenches can be reduced, and the device can be downsized in its lateral direction.

In addition, in Japanese Patent Application Laid-open No. 2003-101027 (see, in particular, FIG. 2(a), FIG. 2(b), and FIG. 5), there is a disclosure that the source regions and the base contact regions are alternately arranged in the surface of the substrate along the trenches in a stripe pattern so that an interval between the adjacent trenches is reduced, with the result that the device can be further downsized in its lateral direction.

However, in the structure in which the source regions and the base contact regions are alternately arranged in the surface of the substrate along the trenches in the stripe pattern, it is necessary to form the base contact regions in the surface of the substrate while sacrificially reducing the area of the source regions necessary for channel formation. No channel is formed in the regions in which the base contact regions are formed, which results in a low channel formation density in a trench extending direction.

SUMMARY OF THE INVENTION

Accordingly, the present invention has an object to provide a semiconductor device which is downsized in its lateral direction and is configured to suppress a reduction in channel formation density in a trench extending direction.

A semiconductor device according to one embodiment of the present invention is as follows.

Specifically, the semiconductor device includes: a semiconductor substrate; a first electrode formed in contact with a front surface of the semiconductor substrate; and a second electrode formed in contact with a back surface of the semiconductor substrate, the semiconductor substrate including: a back surface semiconductor electrode layer of a first conductivity type formed to have a predetermined thickness from the back surface of the semiconductor substrate; a base region of a second conductivity type formed above the back surface semiconductor electrode layer; a trench having a depth from the front surface of the semiconductor substrate to an upper surface of the back surface semiconductor electrode layer; a gate insulating film covering a bottom surface and a side surface of an inside of the trench, and having an upper end portion positioned at a first height between the front surface of the semiconductor substrate and the bottom surface of the trench; a gate electrode embedded into the trench to the first height via the gate insulating film; an insulating film embedded in the trench on the gate insulating film and the gate electrode to the front surface of the semiconductor substrate; and a first region and a second region being in contact with the trench, and alternately arranged in an extending direction of the trench, the first region including a first front surface semiconductor electrode layer of the first conductivity type having a portion along an outer side surface of the trench from the front surface of the semiconductor substrate to the first height, and a portion in contact with the first electrode, the second region including: a base contact region of the second conductivity type having a depth from the front surface of the semiconductor substrate to a second height higher than the first height, a concentration higher than a concentration of the base region a portion at least partially in contact with the base region, and a portion in contact with the first electrode; and a second front surface semiconductor electrode layer having a portion along the outer side surface of the trench from the first height to the second height, and a portion in contact with the first front surface semiconductor electrode layer on a surface perpendicular to the extending direction of the trench.

The "base region" and the "base contact region" in the above description may be referred to as, for example, "body region" and "body contact region", respectively, "base region" and "base contact region" are herein used.

According to the present invention, on the side surface of the trench positioned adjacent to the base contact region, a source region is arranged at a position deeper than the base contact region, to thereby form the channel. There is therefore no need to arrange the source region and the base contact region side by side in the surface of the semiconductor substrate in the lateral direction, and hence it is possible to downsize the device in the lateral direction. Further, the area of the source region necessary for channel formation is not sacrificially reduced in order to form the base contact region, and hence it is possible to suppress the reduction in channel formation density in the trench extending direction.

BRIEF DESCRIPTION OF THE DRAWINGS

FIG. 8A and FIG. 8B are sectional views for illustrating the manufacturing process for the semiconductor device according to the first embodiment of the present invention, in which FIG. 8A is a view for illustrating a structure at a position of the line A-A' of the semiconductor device illustrated in FIG. 1, and FIG. 8B is a view for illustrating a structure at a position of the line B-B'.

FIG. 9A and FIG. 9B are sectional views for illustrating the manufacturing process for the semiconductor device according to the first embodiment of the present invention, in which FIG. 9A is a view for illustrating a structure at the position of the line A-A' of the semiconductor device illustrated in FIG. 1, and FIG. 9B is a view for illustrating a structure at the position of the line B-B'.

DETAILED DESCRIPTION OF THE EMBODIMENTS

Now, with reference to the drawings, semiconductor devices according to embodiments of the present invention are described.

Figure 1:
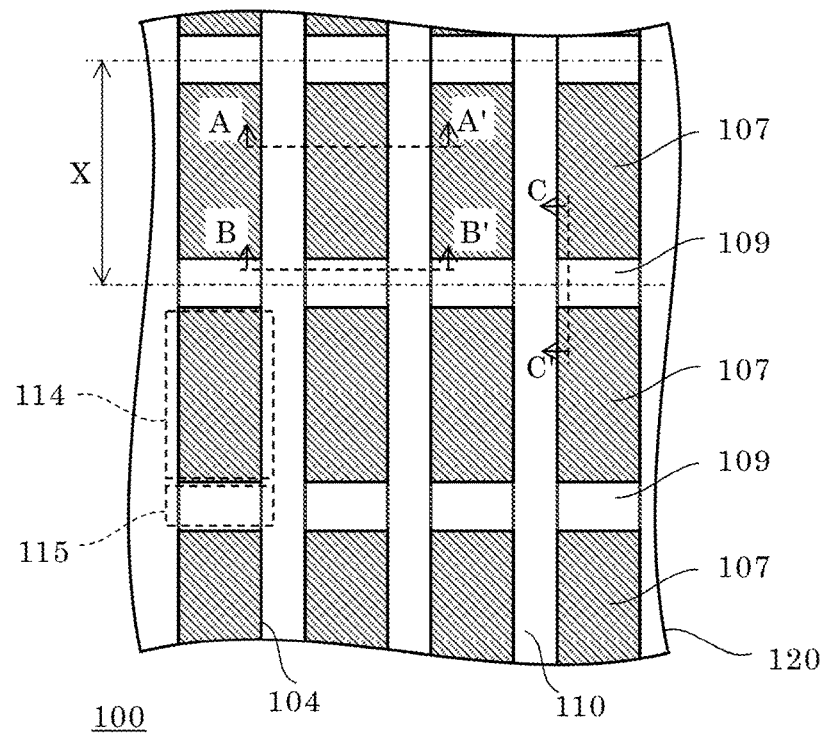
FIG. 1 is a view for illustrating a plane structure of a semiconductor device according to a first embodiment of the present invention.
Figure 2:
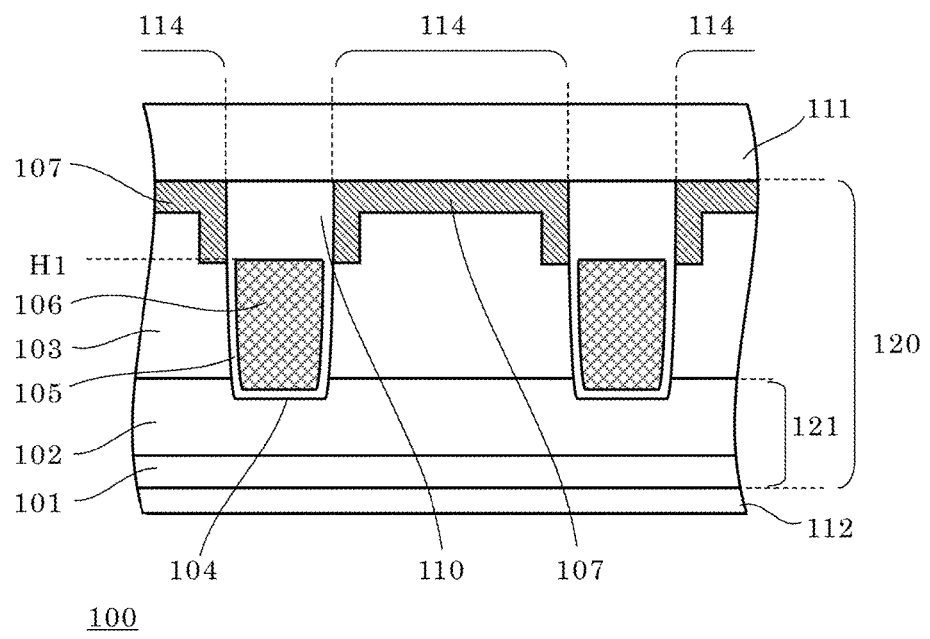
FIG. 2 is a sectional view taken along the line A-A' of the semiconductor device illustrated in FIG. 1.
Figure 3:
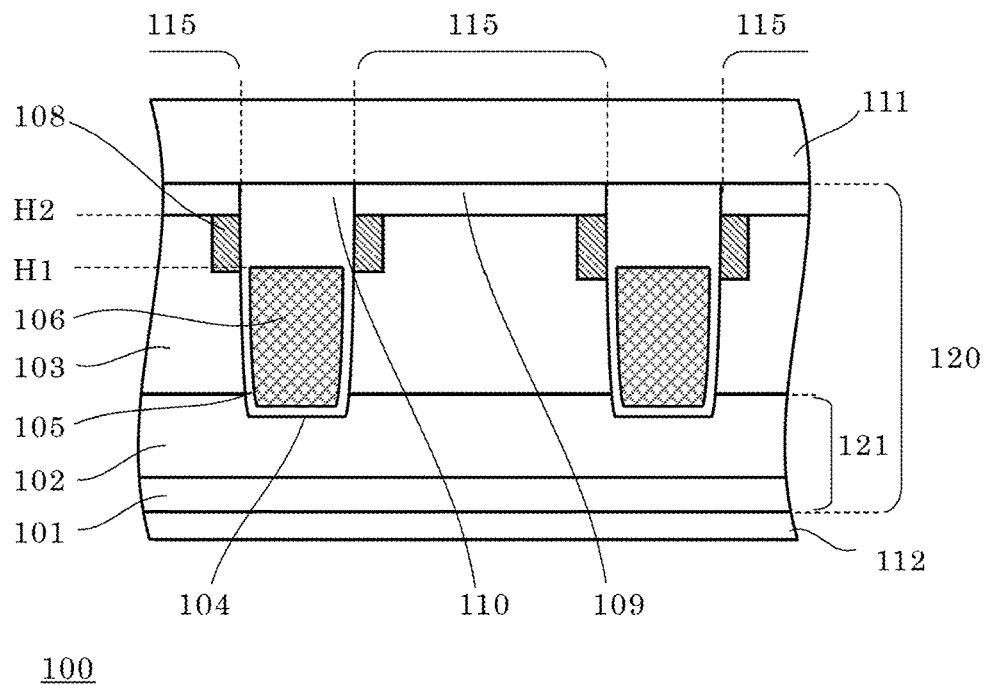
FIG. 3 is a sectional view taken along the line B-B' of the semiconductor device illustrated in FIG. 1.
Figure 4:
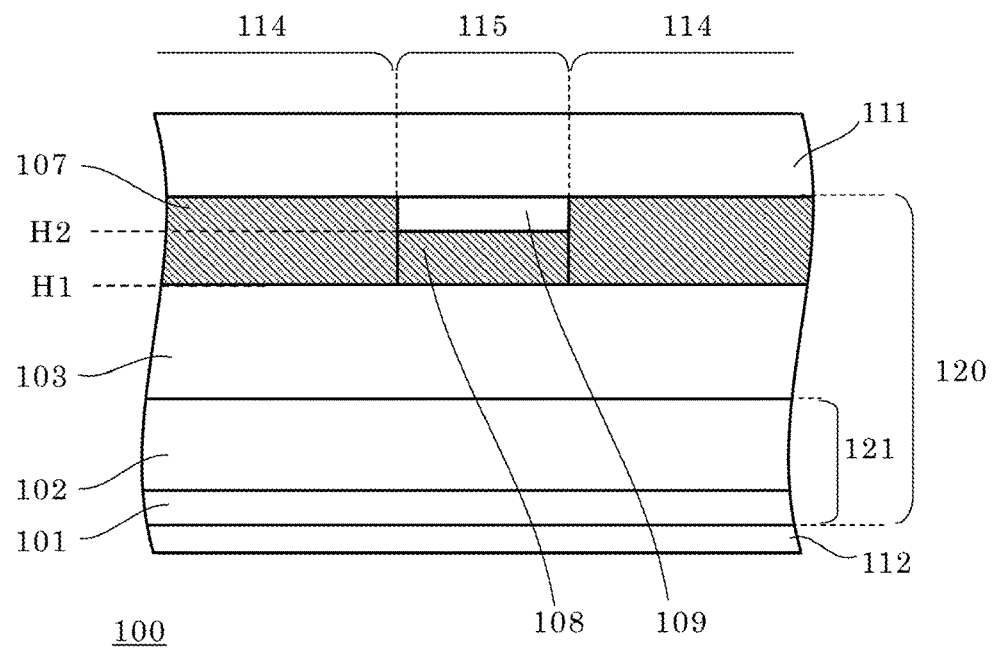
FIG. 4 is a sectional view taken along the line C-C' of the semiconductor device illustrated in FIG. 1.

FIG. 1 is a plan view for illustrating a semiconductor device 100 including a vertical transistor according to a first embodiment of the present invention. FIG. 2 is a sectional view taken along the line A-A' of FIG. 1. FIG. 3 is a sectional view taken along the line B-B' of FIG. 1. FIG. 4 is a sectional view taken along the line C-C' of FIG. 1. Now, the semiconductor device 100 is described by taking a vertical N-channel MOSFET as an example.

As illustrated in FIG. 1, in a front surface of a semiconductor substrate 120 of the semiconductor device 100 according to the first embodiment, a plurality of trenches 104 are formed in a long stripe pattern extending in one direction. Between the adjacent trenches 104, a first region 114 and a second region 115 are alternately arranged in an extending direction of the trench 104 (source electrode 111 arranged at the top surface is omitted).

In the first region 114, an N-type first source region 107 is formed along outer side surfaces of the trenches 104. Further, in the second region 115, a P-type base contact region 109 is formed along the outer side surfaces of the trenches 104. It is not necessary that all intervals X between the P-type base contact regions 109 arranged in the extending direction of the trench 104 (distance from one base contact region 109 to the next base contact region 109) are equal. However, it is desired that the interval X is equal to or less than a certain limiting value in order to stabilize the characteristics of the vertical N-channel MOSFET.

Further, in the first embodiment of FIG. 1, all the first regions 114 and all the second regions 115 are arranged in the same pattern in a direction perpendicular to the extending direction of the trench 104. However, the pattern and arrangement are not necessarily limited to those in FIG. 1. For example, the first region 114 and the second region 115 may be alternately arranged via the trench 104 in the direction perpendicular to the extending direction of the trench 104.

An insulating film 110 is embedded to an upper part of the trench 104 to separate the first regions 114 and separate the second regions 115 which are arranged in the direction perpendicular to the extending direction of the trench 104.

FIG. 2 is a sectional view taken along the line A-A' which includes the first region 114 and the trench 104 of FIG. 1. The semiconductor substrate 120 of the semiconductor device 100 includes a drain layer 121 formed of an N-type high-concentration region 101 and an N-type drift region 102, a P-type base region 103, and an N-type first source region 107. Further, the plurality of trenches 104 are formed in a lateral direction of the semiconductor substrate 120 with a given interval. In order to operate as the vertical N-channel MOSFET, the semiconductor device 100 has a drain electrode 112 formed on a back surface of the semiconductor substrate 120 and the source electrode 111 formed on the front surface of the semiconductor substrate 120. With this structure, a current flows in a vertical direction of the semiconductor device 100.

The N-type high-concentration region 101 is a region serving as a drain of the vertical N-channel MOSFET, and has an impurity concentration of $1 \times 10^{20}/cm^3$ or more so as to obtain the ohmic contact with the drain electrode 112. Further, with such a high impurity concentration, the resistivity is lowered to reduce the drain resistance.

The N-type drift region 102 is a region to secure drain breakdown voltage among the regions which also form the drain of the vertical N-channel MOSFET. In accordance with the desired value of drain breakdown voltage, the impurity concentration and a vertical thickness are determined.

The P-type base region 103 is a region in which a channel of the vertical N-channel MOSFET is to be formed. The impurity concentration and the vertical thickness of the base region 103 are determined by a desired threshold voltage or the drain breakdown voltage. The base region 103 is formed by implanting P-type impurities through the front surface of the semiconductor substrate 120 into the N-type region in which the drift region 102 is to be formed. Thus, the base region 103 has the impurity concentration higher than that of the drift region 102.

The trench 104 is formed so as to have a depth from the front surface of the semiconductor substrate 120 to the upper surface of the drift region 102. Inside the trench 104, a gate insulating film 105 is formed on the inner side surface up to a position of a first height H1. A gate electrode 106 made from polysilicon or the like is embedded in the trench on the gate insulating film 105 up to the position of the first height H1. The gate electrode 106 receives a signal, and the channel is formed in the vertical direction in a region along the outer side surface of the trench 104 in the base region 103. The insulating film 110 is formed in the portion of the trench 104 from the front surface of the semiconductor substrate 120 to the first height H1, to thereby electrically insulate the gate electrode 106 and the source electrode 111.

The first source region 107 is formed above the base region 103. An upper portion (upper surface) of the first source region 107 is in contact with the source electrode 111.

The impurity concentration in a surface in contact with the source electrode 111 of the first source region 107 is set to a concentration of $1\times10^{19}/cm^3$ or more in order to obtain the ohmic contact with the source electrode 111. Further, on the outer side surface of the trench 104, the first source region 107 has a depth portion (side surface) from the front surface of the semiconductor substrate 120 to the position of the first height H1. That is, in the first region 114, the first source region 107 is formed along the outer side surfaces of the trenches 104 so as to cover an upper portion of the base region 103 from the outer side surface of one trench 104 to the outer side surface of the other trench 104 via the front surface of the semiconductor substrate 120.

With this structure, the current which has flowed from the drain electrode 112 flows through the first source region 107 into the source electrode 111 via the high-concentration region 101, the drift region 102, and the channel formed along the outer side surface of the trench 104 in the base region 103.

FIG. 3 is a sectional view taken along the line B-B' which includes the second region 115 and the trench 104 of FIG. 1. The semiconductor substrate 120 of the semiconductor device 100 includes the drain layer 121 formed of the N-type high-concentration region 101 and the N-type drift region 102, the P-type base region 103, an N-type second source region 108, and the base contact region 109. Further, the plurality of trenches 104 are formed in the lateral direction with a given interval. Also in this cross section, in order to operate as the vertical N-channel MOSFET, the semiconductor device 100 has the drain electrode 112 formed on the back surface of the semiconductor substrate 120 and the source electrode 111 formed on the front surface of the semiconductor substrate 120. With this structure, the current flows in the vertical direction.

The base contact region 109 in the second region 115 is formed between a second height H2 higher than the position of the first height H1 and the front surface of the semiconductor substrate 120 in the vertical direction, and has a portion (side surface) in contact with the trench 104 in the lateral direction. Further, a part of a lower portion (bottom surface) of the base contact region 109 is in contact with the base region 103, and an upper portion (upper surface) of the base contact region 109 is in contact with the source electrode 111. The impurity concentration in a surface in contact with the source electrode 111 of the base contact region 109 is set to a concentration of $1\times10^{20}/cm^3$ or more in order to obtain the ohmic contact with the source electrode 111.

The second source region 108 has a portion (one side surface) from the first height H1 to the second height H2 along the outer side surface of the trench 104, a portion (other side surface and bottom surface) in contact with the base region 103, and a portion (upper surface) in contact with the bottom surface of the base contact region 109. Further, a portion (side surface) perpendicular to the extending direction of the trench 104 of the second source region 108 is in contact with the first source region 107 (not shown in FIG. 3).

That is, in the second region 115, the base contact region 109, which has a uniform thickness from the front surface of the semiconductor substrate 120, is formed from the outer side surface of one trench 104 to the outer side surface of the other trench 104, and the second source region 108, which is connected to the first source region 107, is formed in a region along the outer side surface of the trench 104 below the base contact region 109.

With this structure, the current which has flowed from the drain electrode 112 flows into the second source region 108 via the high-concentration region 101, the drift region 102, and the channel formed along the outer side surface of the trench 104 in the base region 103. The current which has flowed into the second source region 108 further flows into the first source region 107 (not shown in FIG. 3) along the extending direction of the trench 104. Afterwards, the current flows into the source electrode 111.

In the first embodiment, in the second region 115 forming the base contact region 109, there is no need to arrange the source region and the base contact region side by side in the lateral direction in the front surface of the semiconductor substrate. As a result, the interval between the adjacent trenches can be reduced, and the semiconductor device can be downsized in the lateral direction.

Further, the area of the source region necessary for the channel formation is not reduced as a sacrifice in order to form the base contact region. As a result, it is possible to suppress the reduction in channel formation density in the trench extending direction, and to achieve a reduction in ON resistance.

Further, in the surface of the semiconductor substrate 120, the first source region 107, the second source region 108, and the base contact region 109 are in contact with the same source electrode 111, and receive the same source potential.

With this structure, the base region 103 receives the source potential from the source electrode 111 via the base contact region 109, to thereby suppress an unintended operation of a parasitic element. As a result, a stable MOSFET operation is secured.

The first source region 107 and the second source region 108 have N-type impurities at the same impurity concentration. The impurity concentrations of the first source region 107 and the second source region 108 are set to an impurity concentration lower than that of the base contact region 109 by about one order of magnitude. The impurity concentration is set as described above so that, as described later, on the outer side surface of the trench 104 from the first height H1 to the front surface of the semiconductor substrate 120 illustrated in FIG. 3, all the second source regions 108 can be formed in a halfway of the processes, and, in a formation process of the base contact region 109 afterwards, the second source region 108 can be converted to a P-type region from the second height H2 to the front surface of the semiconductor substrate 120 by the base contact region 109. In this manner, the second source region 108 along the outer side surface of the trench 104 from the first height H1 to the second height H2, and the base contact region 109 from the second height H2 to the front surface of the semiconductor substrate 120 can be stably formed while suppressing a variation in impurity concentration.

As illustrated in a sectional view of FIG. 4, in a cross section taken along the line C-C' near the outer side surface of the trench 104, which includes the first region 114 and the second region 115 of FIG. 1, the second source region 108 is formed on the lower surface of the base contact region 109, and is connected to the adjacent first source regions 107. Accordingly, the current which has flowed into the second source region 108 from the drain electrode 112 via the channel travels in the lateral direction through the second source region 108 being formed under the base contact region 109 and having a width from the first height H1 to the second height H2. The current flows into the source electrode 111 in the vertical direction after the current reaches the first source region 107.

As described above, the base contact region 109 has a role to give the source potential to the base region 103. However, it is difficult to steadily fix a position which is away from the base contact region 109, for example, the base region 103 being at a midpoint of the interval X of FIG. 1, to the source potential. This is because, through application of the drain voltage, a current based on, for example, impact ionization or leak that occur at a joining surface between the base region 103 and the drift region 102 flows from the position in which the impact ionization or the leak occurs toward the base contact region 109. As a result, as an interval between an occurrence part of the impact ionization or the leak and the base contact region 109 is increased, a base resistance component is increased. Accordingly, a voltage rise with respect to the source potential is liable to occur at that position.

When the potential at a certain position of the base region 103 increases against the source potential, an NPN parasitic bipolar transistor which is formed of the source region, the base region, and the drift region at that position becomes liable to operate, making it difficult to stabilize the characteristics of the vertical N-channel MOSFET. In order to prevent such instability, it is effective to reduce the base resistance by enlarging the base contact region or by reducing the interval X of FIG. 1 to a certain limiting value or less. Such measures however reduce the area of the source region necessary for the channel formation as a sacrifice at the same time. Thus, the channel formation density in the trench extending direction is reduced, and hence it is impossible to avoid an increase in ON resistance of the transistor.

In the first embodiment, even when the base contact region 109 is enlarged or the value of the interval X of FIG. 1 is reduced, the source regions (107 and 108) and the drift region 102 face each other in the vertical direction for all the outer side surfaces of the trenches 104, and hence it is possible to form the channel in the base region 103 between the source region (107 or 108) and the drift region 102. Accordingly, while securing the stable transistor operation, the channel formation density in the trench extending direction can be increased, and the reduction in ON resistance can be achieved.

Next, with reference to FIG. 5 to FIG. 9B, a manufacturing method for the semiconductor device according to the first embodiment of the present invention is described by taking the vertical N-channel MOSFET as an example.

Figure 5:
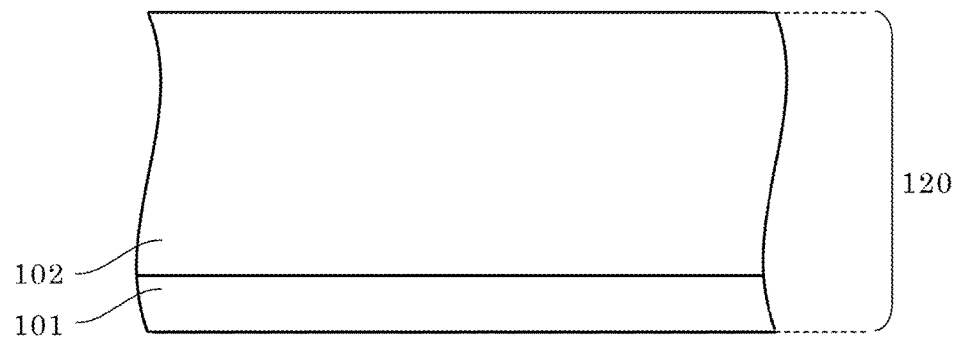
FIG. 5 is a sectional view for illustrating a manufacturing process for the semiconductor device according to the first embodiment of the present invention.

First, as illustrated in FIG. 5, the semiconductor substrate 120, which includes the N-type high-concentration region 101 and the N-type drift region 102 having the impurity concentration lower than that of the high-concentration region 101, is prepared.

Figure 6:
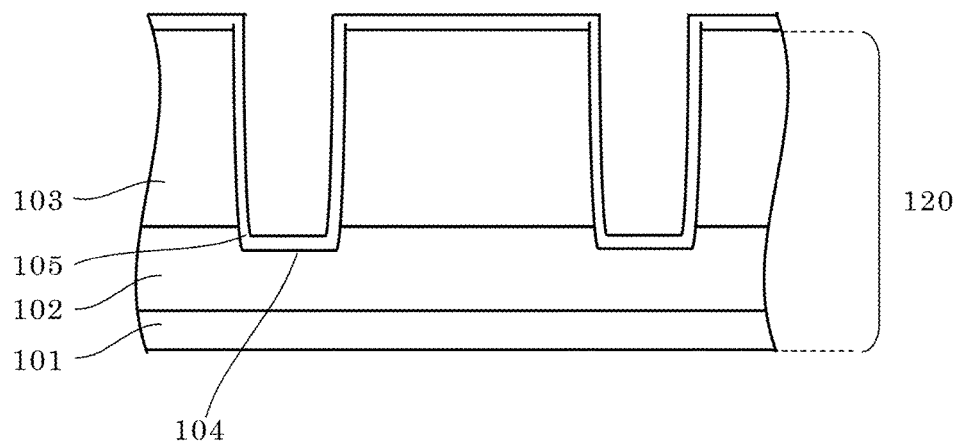
FIG. 6 is a sectional view for illustrating the manufacturing process for the semiconductor device according to the first embodiment of the present invention.

Next, as illustrated in FIG. 6, the P-type base region 103 is formed by ion implantation and thermal diffusion. Next, the trenches 104, each of which has a depth reaching the upper surface of the N-type drift region 102, are formed in a layout of a long stripe pattern to be extended in one direction in the front surface of the semiconductor substrate 120. Next, the gate insulating film 105 is formed in the region including the inner side surface and the bottom surface of the trench 104.

Figure 7:
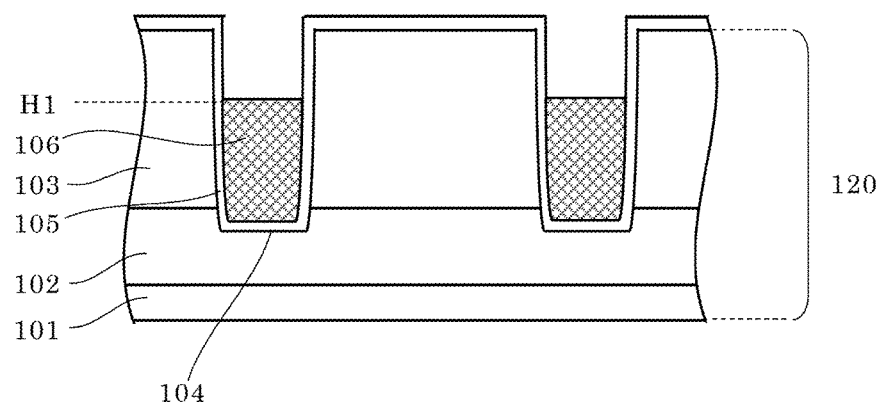
FIG. 7 is a sectional view for illustrating the manufacturing process for the semiconductor device according to the first embodiment of the present invention.

Next, as illustrated in FIG. 7, a polysilicon film is deposited so as to be embedded into the trench 104 without any gap, and the high-concentration impurities are introduced into the polysilicon film so that the polysilicon film has conductivity. Next, the poly silicon film is etched back to the first height H1 inside the trench 104 by partially removing the polysilicon film, to thereby form the gate electrode 106.

The order of the process so far is not limited thereto, and any order can be adopted as long as the manufacturing process can provide the structure illustrated in FIG. 7. For example, after the process of forming the trench 104, the process of forming the base region 103 may be performed.

Figure 8A:
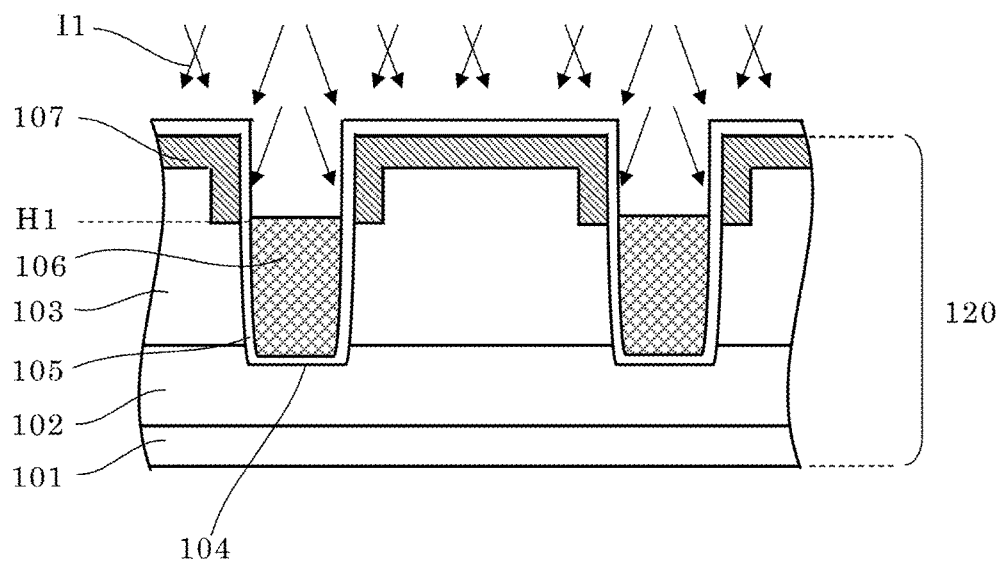
Figure 8B:
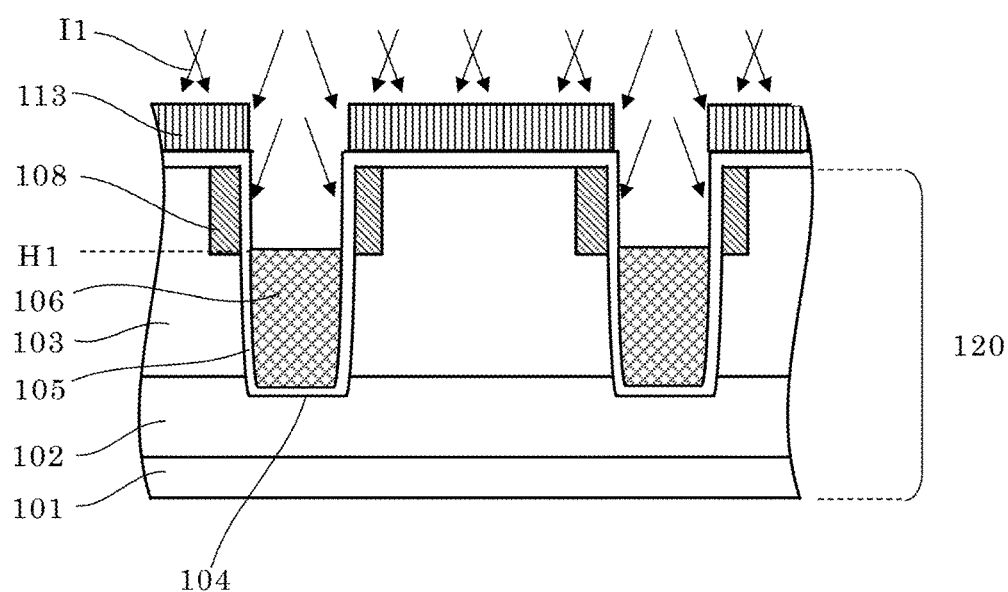

Next, as illustrated in FIGS. 8A and 8B, the first source region 107 and the second source region 108 are simultaneously formed by a single process. FIG. 8A is a sectional view taken along the line A-A' of FIG. 1 and corresponds to a process of forming the first source region 107 in the first region 114. FIG. 8B is a sectional view taken along the line B-B' of FIG. 1 and corresponds to the process of forming the second source region 108 in the second region 115.

First, a photoresist 113 is applied to the entire semiconductor substrate 120, and the photoresist 113 is patterned by a photolithography technology so that the photoresist 113 remains only on the second region 115 of FIG. 1. Next, the N-type impurities are implanted as indicated by I1 by an implantation amount achieving a concentration of about $1 \times 10^{19}/cm^3$ at an angle of 10 degrees or more with respect to the vertical direction of the front surface of the semiconductor substrate 120. At this time, as illustrated in FIG. 8A, in the line A-A' of FIG. 1, the N-type second source region 107 is formed in the front surface of the semiconductor substrate 120 and on the outer side surface of the trench 104 over a region of the first height H1 or higher, due to the absence of the photoresist. Meanwhile, in the line B-B' of FIG. 1, as illustrated in FIG. 8B, the N-type second source region 108 is formed on the outer side surface of the trench 104 over a region from the front surface of the semiconductor substrate 120 to the first height H1, due to the presence of the photoresist 113 on the front surface of the semiconductor substrate 120.

In order to form the N-type source regions 107 and 108 on the outer side surfaces of the plurality of trenches 104, the N-type source regions 107 and 108 may be formed by the ion implantation that may be a rotary implantation with an inclination as indicated by I1 of FIGS. 8A and 8B, or a plurality of implantations with a change in direction of angle.

Figure 9A:
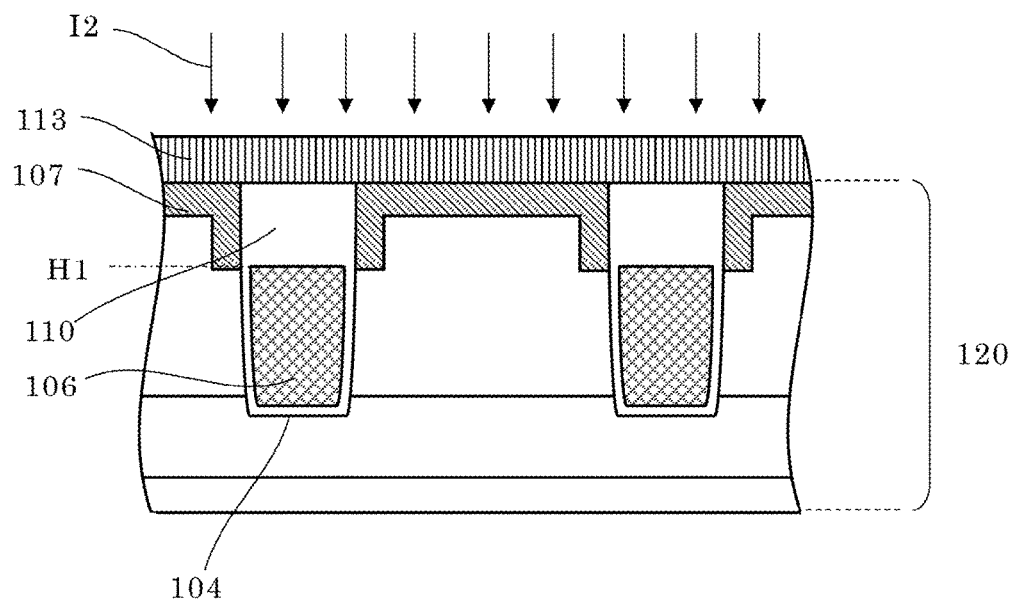
Figure 9B:
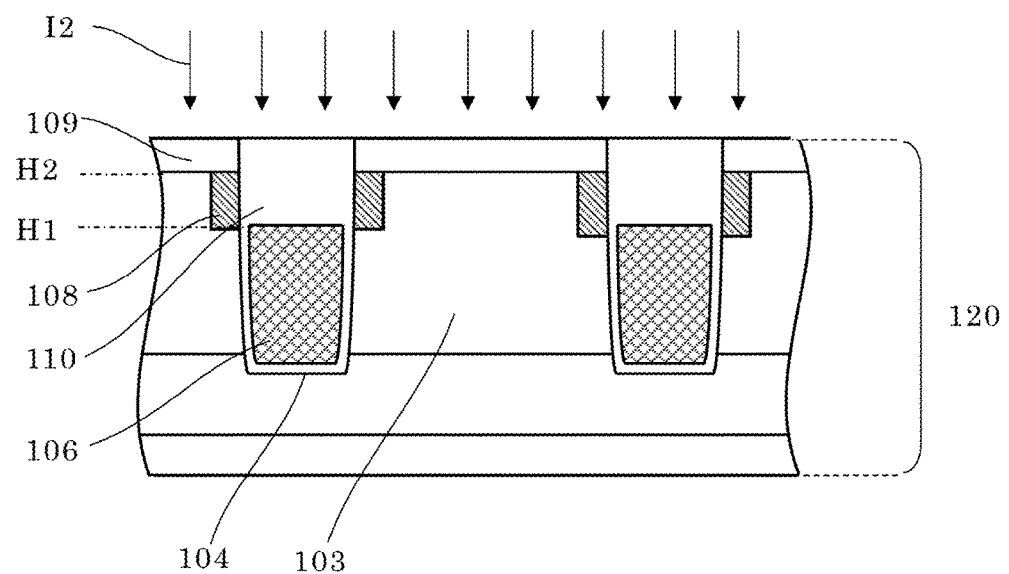

Next, as illustrated in FIGS. 9A and 9B, an insulating film, for example, a silicon oxide film or a silicon nitride film, is deposited so as to be embedded in the trench 104 on the gate electrode 106 without any gap. Next, the insulating film is etched back to a height of the front surface of the semiconductor substrate 120 inside the trench 104 by removing the insulating film on the semiconductor substrate 120, to thereby form the insulating film 110.

Next, the base contact region 109 is formed. FIG. 9A is a sectional view taken along the line A-A' of FIG. 1 and corresponds to a process of forming the base contact region 109. FIG. 9B is a sectional view taken along the line B-B' of FIG. 1 and corresponds to the process of forming the base contact region 109.

First, the photoresist 113 is applied to the entire semiconductor substrate 120, and the photoresist 113 is patterned by the photolithography technology so that the photoresist 113 is opened only on the second region 115 of FIG. 1. In this case, as illustrated in FIG. 9B, the photoresist on the trench 104 between the base contact regions 109 may be removed. Next, the P-type impurities are implanted by an implantation amount achieving a concentration of about $1 \times 10/cm^3$. Although the implantation angle of the P-type impurities may be any angle, an angle of 7 degrees or less for suppressing a channeling phenomenon is desired.

As illustrated in FIG. 9A, the first region 114 of the line A-A' of FIG. 1 is covered with the photoresist 113, and P-type impurities 12 are not implanted into the first region 114. Further, as illustrated in FIG. 9B, in the second region 115 of the line B-B' of FIG. 1, the P-type impurities 12 are implanted in the front surface of the semiconductor substrate 120, and a region of the N-type second source region 108 having a depth from the front surface of the semiconductor substrate 120 to the second height H2 is replaced by the base contact region 109.

Next, although not shown, the source electrode 111 is formed on the entire front surface of the semiconductor substrate 120. Afterwards, the drain electrode 112 is formed on the entire back surface of the semiconductor substrate 120, and hence the semiconductor device 100 of the first embodiment as illustrated in FIG. 1 to FIG. 4 can be obtained.

Figure 10:
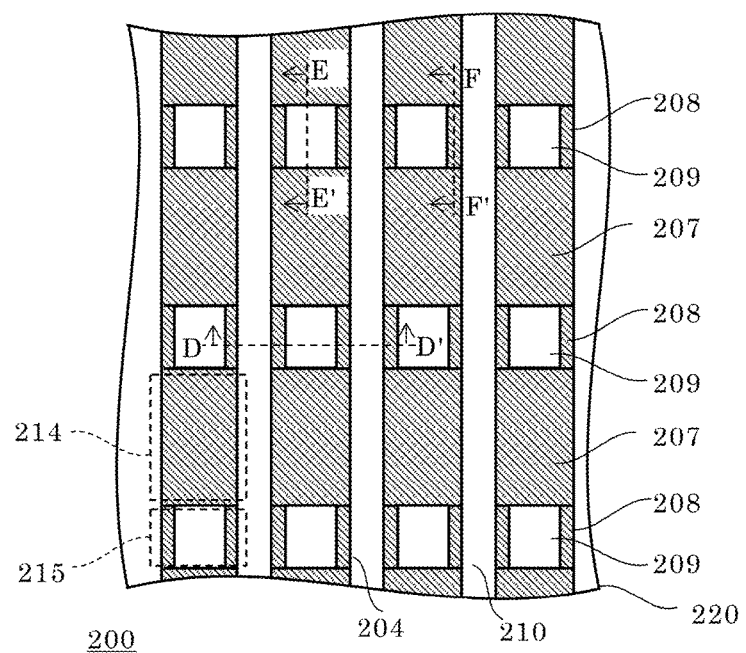
FIG. 10 is a view for illustrating a plane structure of a semiconductor device according to a second embodiment of the present invention.
Figure 11:
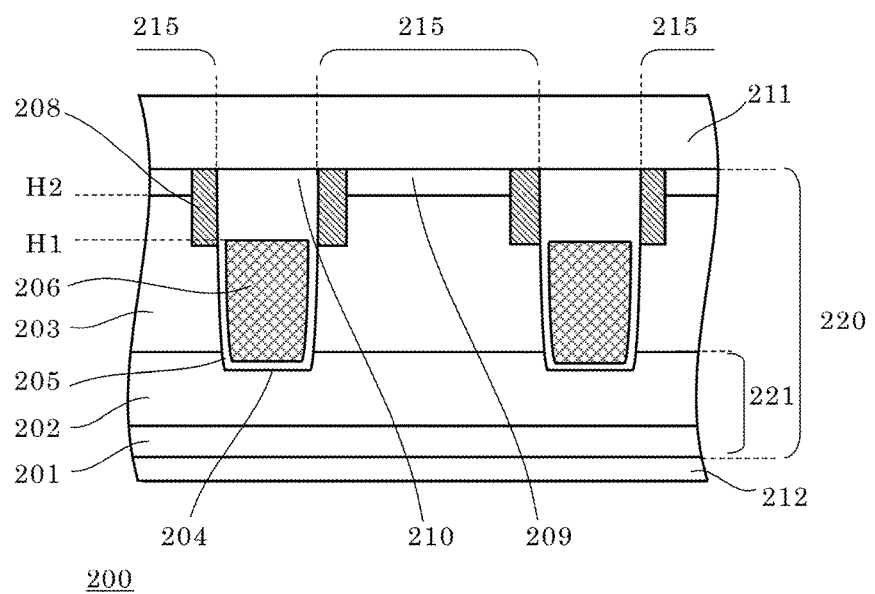
FIG. 11 is a sectional view taken along the line D-D' of the semiconductor device illustrated in FIG. 10.
Figure 12:
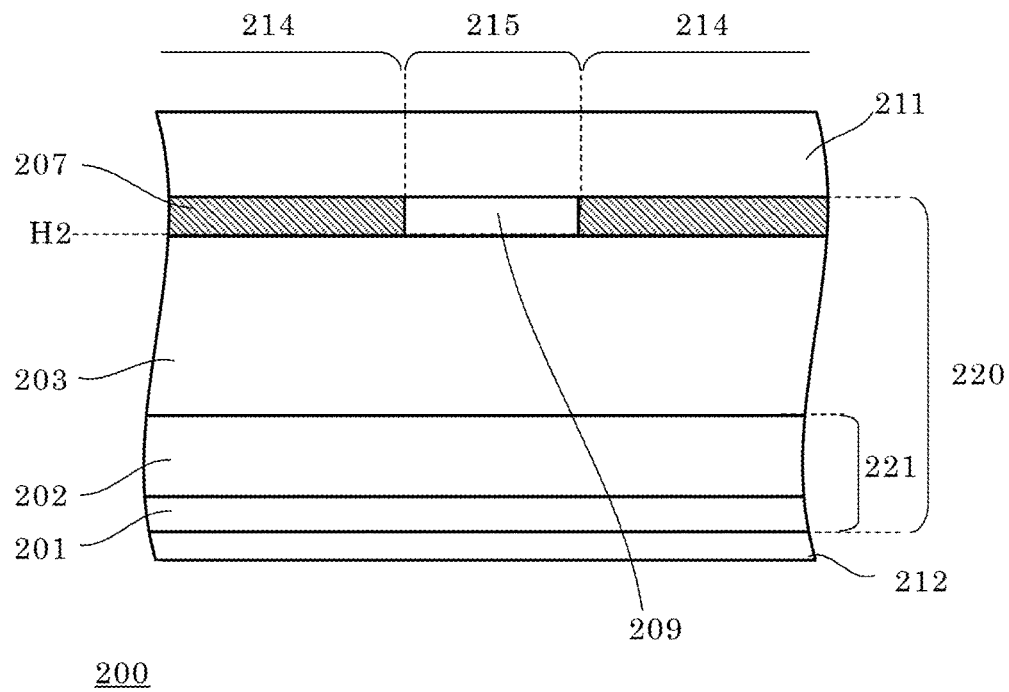
FIG. 12 is a sectional view taken along the line E-E' of the semiconductor device illustrated in FIG. 10.
Figure 13:
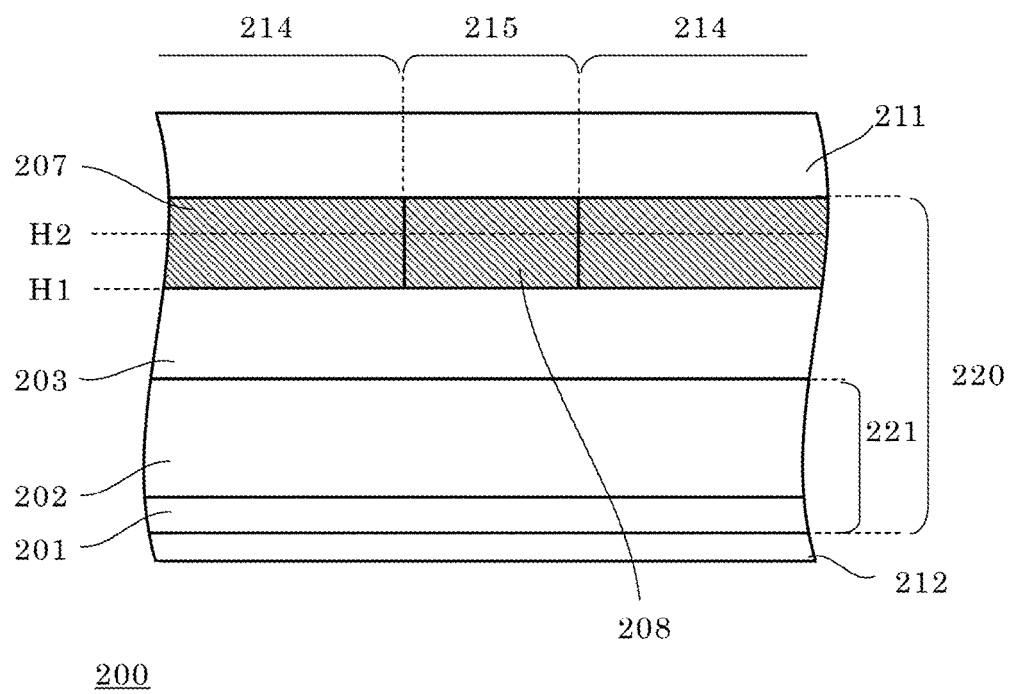
FIG. 13 is a sectional view taken along the line F-F' of the semiconductor device illustrated in FIG. 10.

FIG. 10 is a plan view for illustrating a semiconductor device 200 including a vertical transistor, which represents a second embodiment of the present invention. FIG. 11 is a sectional view taken along the line D-D' of FIG. 10. FIG. 12 is a sectional view taken along the line E-E' of FIG. 10. FIG. 13 is a sectional view taken along the line F-F' of FIG. 10. Now, similarly to the first embodiment, the semiconductor device 200 is described by taking a vertical N-channel MOSFET as an example.

As illustrated in FIG. 10, in a front surface of a semiconductor substrate 220 of the semiconductor device 200 according to the second embodiment, trenches 204 are formed in a long stripe pattern to be extended in one direction. Between the adjacent trenches 204, a first region 214 and a second region 215 are alternately arranged in an extending direction of the trench 204 (source electrode 211 arranged at the top surface is omitted).

In the first region 214, an N-type first source region 207 is formed along outer side surfaces of the trenches 204. Further, unlike the first embodiment, in the second region 215, an N-type second source region 208 is formed so that one portion (side surface) of the N-type second source region 208 is in contact with the outer side surface of the trench 204. Further, a P-type base contact region 209 is formed so as to be in contact with the other portion (side surface) of the N-type second source region 208.

In the second embodiment of FIG. 10, all the first regions 214 and all the second regions 215 are arranged in the same pattern in a direction perpendicular to the extending direction of the trench 204. However, the point that the pattern and position are not particularly required to be uniform is the same as the first embodiment.

An insulating film 210 is embedded to an upper part of the trench 204 to separate the first regions 214 and separate the second regions 215 which are arranged in the direction perpendicular to the extending direction of the trench 204.

Further, although not shown, a cross-sectional structure near the first region 214 of FIG. 10 is the same as the structure of FIG. 2 for illustrating the cross section of the first region of the first embodiment. However, the second embodiment is different from the first embodiment in that the impurity concentration in the surface in contact with the source electrode 111 of the first source region 207 is set to a concentration of $1 \times 10^{20}/cm^3$ or more in order to obtain the ohmic contact with the source electrode 211.

FIG. 11 is a sectional view taken along the line D-D' which includes the second region 215 and the trench 204 of FIG. 10. The semiconductor substrate 220 of the semiconductor device 200 includes a drain layer 221 formed of an N-type high-concentration region 201 and an N-type drift region 202, a P-type base region 203, an N-type second source region 208, and a base contact region 209.

The base contact region 209 in the second region 215 is formed between a second height H2 higher than the position of a first height H1 and the front surface of the semiconductor substrate 220 in a vertical direction of the semiconductor substrate 220. Meanwhile, unlike the first embodiment, the base contact region 209 has a portion (side surface) in contact with the second source region 208 in a lateral direction of the semiconductor substrate 220. Further, a part of a lower portion (bottom surface) of the base contact region 209 is in contact with the base region 203, and an upper portion (upper surface) of the base contact region 209 is in contact with the source electrode 211. The impurity concentration in a surface in contact with the source electrode 211 of the base contact region 209 is set to a concentration of $1 \times 10^{19}/cm^3$ or more so as to obtain the ohmic contact with the source electrode 211, which is also different from the first embodiment.

The second source region 208 has a portion (one side surface) from the first height H1 to the front surface of the semiconductor substrate 220 along the outer side surface of the trench 204, a portion (part of the other side surface and bottom surface) in contact with the base region 203, a portion (part of the other side surface) in contact with the side surface of the base contact region 209, and a portion (upper surface) in contact with the source electrode 211. The impurity concentration of the surface in contact with the source electrode 211 of the second source region 208 is set to a concentration of $1 \times 10^{20}/cm^3$ or more in order to obtain the ohmic contact with the source electrode 211.

In the second embodiment, the first source region 207 and the second source region 208 have N-type impurities at the same impurity concentration. The impurity concentrations of the first source region 207 and the second source region 208 are set to an impurity concentration higher than that of the base contact region 209 by about one order of magnitude. This is because, on the outer side surface of the trench 204 from the first height H1 to the front surface of the semiconductor substrate 220 illustrated in FIG. 11, all the second source regions 208 are formed in a halfway of the manufacturing processes so that, in a formation process of the base contact region 209 afterwards, the second source region 208 is not converted to a P-type region anymore from the second height H2 to the front surface of the semiconductor substrate 220 by the base contact region 209. In this manner, the second source region 208 along the outer side surface of the trench 204 from the first height H1 to the front surface of the semiconductor substrate 220 can be stably formed while suppressing a variation in impurity concentration.

As illustrated in FIG. 12, in the cross section of the line E-E' of FIG. 10, the first source region 207 and the base contact region 209 are arranged so as to be in contact with each other in the extending direction of the trench 204. A lower surface of the base contact region 209 is in contact with the base region 203, and functions to fix the potential of the base region 203 to the source potential. This structure is the same as that of the first embodiment.

In FIG. 13, a cross section taken along the line F-F' of FIG. 10 near the outer side surface of the trench 204 is illustrated. In this region, the second embodiment is different from the first embodiment in that the second source region 208 is formed in a region from the surface of the semiconductor substrate 220 to the first height H1 and that no base contact region 209 is formed. The first source region 207 and the second source region 208 are arranged so as to be in contact with each other in the extending direction of the trench 204.

In FIG. 4 of the first embodiment, the current which has flowed from the channel into the second source region 108 flows toward the first source region 107 in the lateral direction, and flows into the source electrode 111 immediately above the first source region 107. With this current flow, the ON resistance of the vertical transistor is influenced by the source resistance based on a length of the current path. In contrast, in FIG. 13 of the second embodiment, the current which has flowed from the channel into the second source region 208 flows into the source electrode 211 immediately above the second source region 208 as it is without being influenced by the base contact region 209. The source resistance of the second region 215 can therefore be reduced to the same level as the source resistance of the source region 207 of the first region 214 because a length of the current path is smaller than that of the first embodiment, and the increase in ON resistance can be suppressed.

Further, the first source region 207 and the second source region 208 have the impurity concentration higher than that of the first source region 107 and the second source region 108 of the first embodiment by about one order of magnitude, and are low in resistivity. Consequently, in also this regard, the first source region 207 and the second source region 208 contribute to the suppression of the reduction in source resistance and the increase in ON resistance.

That is, through adoption of the structure described above, the second embodiment can further achieve the reduction in ON resistance because the source resistance can be reduced as compared to the first embodiment.

A manufacturing method for the semiconductor device 200 of the second embodiment is different from that of the first embodiment in that the lower limits of the impurity concentrations of the first source region 207 and the second source region 208 are set to a concentration of $1 \times 10^{20}/cm^3$ or more as compared to the first embodiment in which the lower limits of the impurity concentrations of the first source region 107 and the second source region 108 are set to $1 \times 10^{19}/cm^3$. Further, the lower limit of the impurity concentration of the base contact region 209 is changed from a concentration of $1 \times 10^{20}/cm^3$ of the first embodiment to a concentration of $1 \times 10^{19}/cm^3$ or more. The remaining manufacturing method is the same as the method described in the first embodiment with reference to FIG. 5 to FIG. 9B.

The structures of the first embodiment and the second embodiment described above are not limited to the vertical N-channel MOSFETs described above as examples, and it is understood that the structures can be applied to a vertical P-channel MOSFET by changing the polarity of the conductivity type. Further, the structures can be applied to an insulating gate bipolar transistor by inserting a collector layer of the opposite conductivity type of the drain region between the drain region and the drain electrode. The application to the insulating gate bipolar transistor can be achieved by reversing the polarity of the high-concentration region formed on the back surface side of the semiconductor substrate.

The embodiments of the present invention have been, but the present invention is not limited to the above-mentioned embodiments, and it is understood that various modifications can be made thereto without departing from the gist of the present invention. For example, the layout pattern of the trenches is not necessarily required to be straight, and the present invention can be applied to various patterns as long as the trench extends in one direction.

What is claimed is:

1. A semiconductor device, comprising:
   a semiconductor substrate;
   a first electrode in contact with a front surface of the semiconductor substrate; and
   a second electrode in contact with a back surface of the semiconductor substrate,
   the semiconductor substrate comprising:
   a back surface semiconductor electrode layer of a first conductivity type having a predetermined thickness from the back surface of the semiconductor substrate;
   a base region of a second conductivity type above the back surface semiconductor electrode layer;
   a trench having a depth from the front surface of the semiconductor substrate to an upper surface of the back surface semiconductor electrode layer;
   a gate insulating film covering a bottom surface and a side surface of the trench, and having an upper end portion at a first height between the front surface of the semiconductor substrate and the bottom surface of the trench;
   a gate electrode embedded in the trench and having an upper end at the first height via the gate insulating film;
   an insulating film embedded in the trench on the gate insulating film and the gate electrode and extending to the front surface of the semiconductor substrate; and
   a first region and a second region in contact with the trench, and alternately arranged in an extending direction of the trench,
   the first region comprising:
   a first front surface semiconductor electrode layer of the first conductivity type having a portion along an outer side surface of the trench from the front surface of the semiconductor substrate to the first height, and a portion in contact with the first electrode,
   the second region comprising:
   a base contact region of the second conductivity type having a depth from the front surface of the semiconductor substrate to a second height higher than the first height, an impurity concentration higher than an impurity concentration of the base region, a portion at least partially in contact with the base region, and a portion in contact with the first electrode; and
   a second front surface semiconductor electrode layer having a portion along the outer side surface of the trench from the first height to the second height, and a portion in contact with the first front surface semiconductor electrode layer on a surface perpendicular to the extending direction of the trench.

2. The semiconductor device according to claim 1, wherein the second front surface semiconductor electrode layer has an upper surface in contact with a lower surface of the base contact region.

3. The semiconductor device according to claim 1, wherein the second front surface semiconductor electrode layer has an upper portion in contact with the first electrode.

4. The semiconductor device according to claim 1, wherein the semiconductor device comprises an insulating gate bipolar transistor comprising a collector layer of the second conductivity type between the back surface semiconductor electrode layer and the second electrode.

5. The semiconductor device according to claim 2, wherein the semiconductor device comprises an insulating gate bipolar transistor comprising a collector layer of the second conductivity type between the back surface semiconductor electrode layer and the second electrode.

6. The semiconductor device according to claim 3, wherein the semiconductor device comprises an insulating gate bipolar transistor comprising a collector layer of the second conductivity type between the back surface semiconductor electrode layer and the second electrode.

* * * * *